(12) United States Patent
Dao et al.

(10) Patent No.: US 8,039,386 B1
(45) Date of Patent: Oct. 18, 2011

(54) METHOD FOR FORMING A THROUGH SILICON VIA (TSV)

(75) Inventors: Thuy B. Dao, Austin, TX (US); Ross E. Noble, Austin, TX (US); Dina H. Triyoso, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 0 days.

(21) Appl. No.: 12/748,101

(22) Filed: Mar. 26, 2010

(51) Int. Cl.
*H01L 21/44* (2006.01)
(52) U.S. Cl. ........ 438/618; 438/667; 438/689; 438/701; 257/E21.597
(58) Field of Classification Search .................. 438/654, 438/667, 618, 689, 701, 640, 753; 257/E21.597
See application file for complete search history.

(56) References Cited

U.S. PATENT DOCUMENTS

| | | | | |
|---|---|---|---|---|
| 5,895,245 | A * | 4/1999 | Harvey et al. | 438/305 |
| 6,025,273 | A * | 2/2000 | Chen et al. | 438/706 |
| 6,168,726 | B1 * | 1/2001 | Li et al. | 216/79 |
| 6,323,121 | B1 | 11/2001 | Liu et al. | |
| 6,431,182 | B1 | 8/2002 | Rakhshandehroo et al. | |
| 6,620,741 | B1 * | 9/2003 | Gracias et al. | 438/780 |
| 2005/0029630 | A1 * | 2/2005 | Matsuo | 257/628 |
| 2010/0013060 | A1 * | 1/2010 | Lamy et al. | 257/621 |

OTHER PUBLICATIONS

U.S. Appl. No. 12/275,659, filed Nov. 21, 2008.
Mathew V. et al.; "Through-Silicon Via Fill for 3D Interconnect Applications"; Electrochemical Society; 2009; 1 Pg.
Schaper, Leonard W. et al.; "Architectural Implications and Process Development of 3-D VLSI Z-Axis Interconnects Using Through Silicon Vias"; IEEE Transactions on Advanced Packaging; Aug. 2005; vol. 28, No. 3; IEEE, pp. 356-366.
Ranganathan, N. et al.; "Through-Wafer Interconnection by Deep Damascene Process for MEMS and 3D Wafer Level Packaging; Electronics Packaging Technology Conference"; 2005; IEEE, pp. 238-242.

* cited by examiner

*Primary Examiner* — Michael Trinh
(74) *Attorney, Agent, or Firm* — Joanna G. Chiu; Kim-Marie Vo

(57) ABSTRACT

A method of forming a through silicon via includes forming a via opening in a substrate using a hard mask, wherein a polymer is formed in the via opening. A first wet clean removes a first portion of the polymer and forms a first carbon containing oxide along portions of the sidewalls. A first ash process modifies the first carbon containing oxide and removes a second portion of the polymer. A first wet etch removes the modified first carbon containing oxide and a third portion of the polymer. A second ash process forms a second carbon containing oxide along at least a portion of the sidewalls. A second wet etch process removes the second carbon containing oxide and a fourth portions of the polymer. A third ash process forms a third carbon containing oxide along portions of the sidewalls and removes any remaining portions of the polymer.

20 Claims, 6 Drawing Sheets

US 8,039,386 B1

METHOD FOR FORMING A THROUGH SILICON VIA (TSV)

BACKGROUND

1. Field

This disclosure relates generally to semiconductor processing, and more specifically, to a method for forming a through silicon via.

2. Related Art

Through silicon vias (TSV) with a high aspect ratio are typically formed using an etch-deposition-etch process sequence. The deposition step puts down a fluorocarbon polymer to protect the sidewall of the via opening and thus allows etching of the high aspect ratio via. One such process which uses this fluorocarbon polymer was developed by Bosch and may be referred to as the Bosch process. However, the Bosch process results in silicon-containing fluorocarbon polymer residual that is deposited on the sidewalls and bottom of the via opening. This polymer needs to be removed prior to the fill process in order to produce a reliable TSV.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

DETAILED DESCRIPTION

As described above, an etch-deposition-etch process for forming a high aspect ratio opening, such as the Bosch process, results in difficult to remove polymers remaining in the through silicon via opening after its formation. In one embodiment, a series of processes, including a first wet clean, followed by a first ash process, followed by a first wet etch process, followed by a second ash process, followed by a second wet etch process, and followed by a third ash process, may be used to remove the polymers left behind by the etch process used in forming the through silicon via (TSV) opening. In this manner, a subsequent conductive fill in the TSV opening results in a reliable conductive TSV without contamination by the polymer. Also, in one embodiment, the series of processes used to remove the residual polymers may be followed by a second wet clean process prior to the conductive fill. Note that the process used to form a TSV will be described below in reference to both the cross-sections of FIGS. 1-10 and flow 50 illustrated in the flow diagram of FIG. 11.

Figure 1:
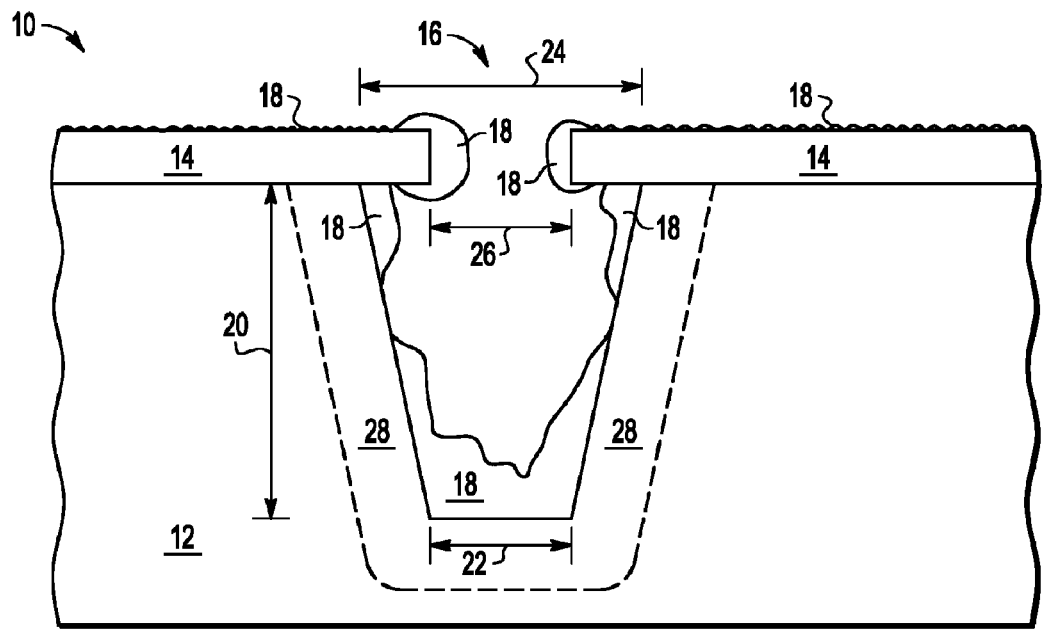
FIG. 1 illustrates a cross-sectional view of a semiconductor structure having a hard mask over a semiconductor substrate and an opening formed in the semiconductor substrate, in accordance with one embodiment of the present invention.

FIG. 1 illustrates a cross-sectional view of a semiconductor structure 10 in accordance with one embodiment of the present invention. Semiconductor structure 10 includes a semiconductor substrate 12, a hard mask layer 14 over substrate 12, a mask opening within hard mask 14, and a tapered via opening 16 in substrate 12. Semiconductor substrate 12 can be any semiconductor material or combinations of materials, such as silicon, gallium arsenide, silicon germanium, silicon-on-insulator (SOI), the like, and combinations of the above. For ease of explanation, it will be assumed that substrate 12 is a silicon substrate. In one embodiment, an opening is first formed in hard mask 14 using any known patterning and etch process. After the opening is formed in hard mask 14, hard mask 14 is used to form tapered via opening 16. In one embodiment, an iterative etch-deposition-etch process, such as the Bosch process, is used to form tapered via opening 16. However, as a result of the fluorocarbon polymer used during the Bosch process, a silicon, carbon, and fluorine (Si, C, and F) containing polymer 18 remains along the sidewalls and bottom of tapered via opening 16. Si, C, and F containing polymer 18 also forms along a top surface and sidewalls of hard mask 14. Note that, in one embodiment, Si, C, And F containing polymer 18 is non-contiguous. Also, as a result of the etch-deposition-etch process to form tapered opening 16, carbon from this process becomes buried in substrate 12 along edges of the tapered via opening, which is illustrated in FIG. 1 as carbon-containing region 28. In one embodiment, carbon-containing region 28 extends approximately 30 Angstroms into substrate 12. In one embodiment, tapered via opening 16 has a high aspect ratio with a width 24 at the top of opening 16 of approximately 3.3 microns (+/−0.2 microns) and a depth 20 of approximately 80 microns. In one embodiment, opening 16 has a width 22 at the bottom of the opening of approximately 1.3 microns. In alternate embodiments, note that opening 16 may not be tapered. Also, in one embodiment, the opening in hard mask 14 has a diameter 26 of approximately 2.5 microns. Therefore, in one embodiment, the opening in hard mask 14 has a smaller diameter than a top of tapered via opening 16 and thus overhangs tapered via opening 16.

Figure 9:
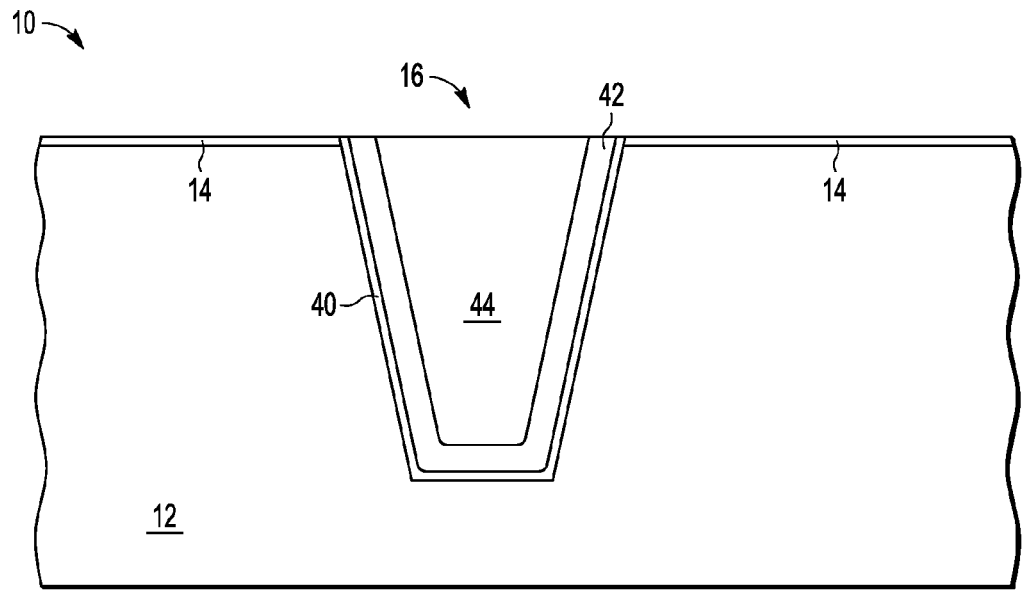
FIG. 9 illustrates a cross-sectional view of the semiconductor structure of FIG. 8, after formation of an adhesive layer and conductive fill in the opening, in accordance with one embodiment of the present invention.
Figure 10:
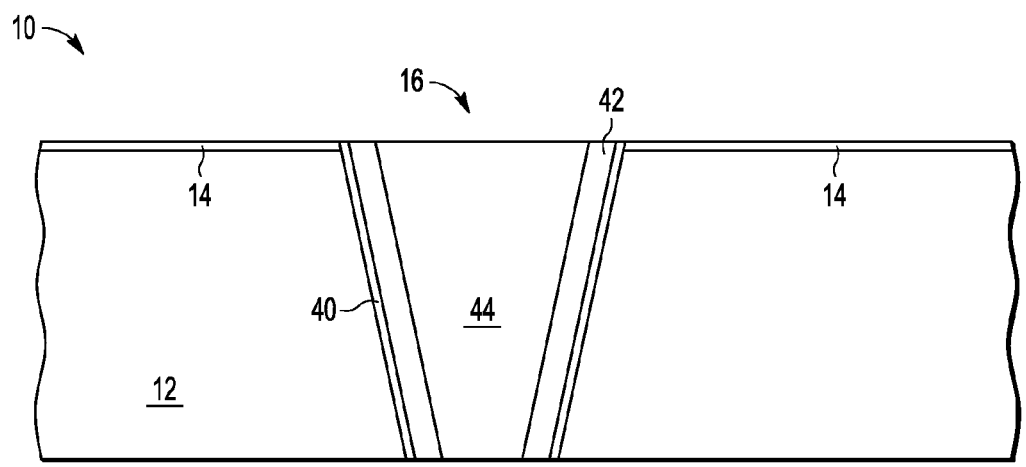
FIG. 10 illustrates a cross-sectional view of the semiconductor structure of FIG. 9, after a portion of the semiconductor substrate is removed to form a TSV, in accordance with one embodiment of the present invention.
Figure 11:
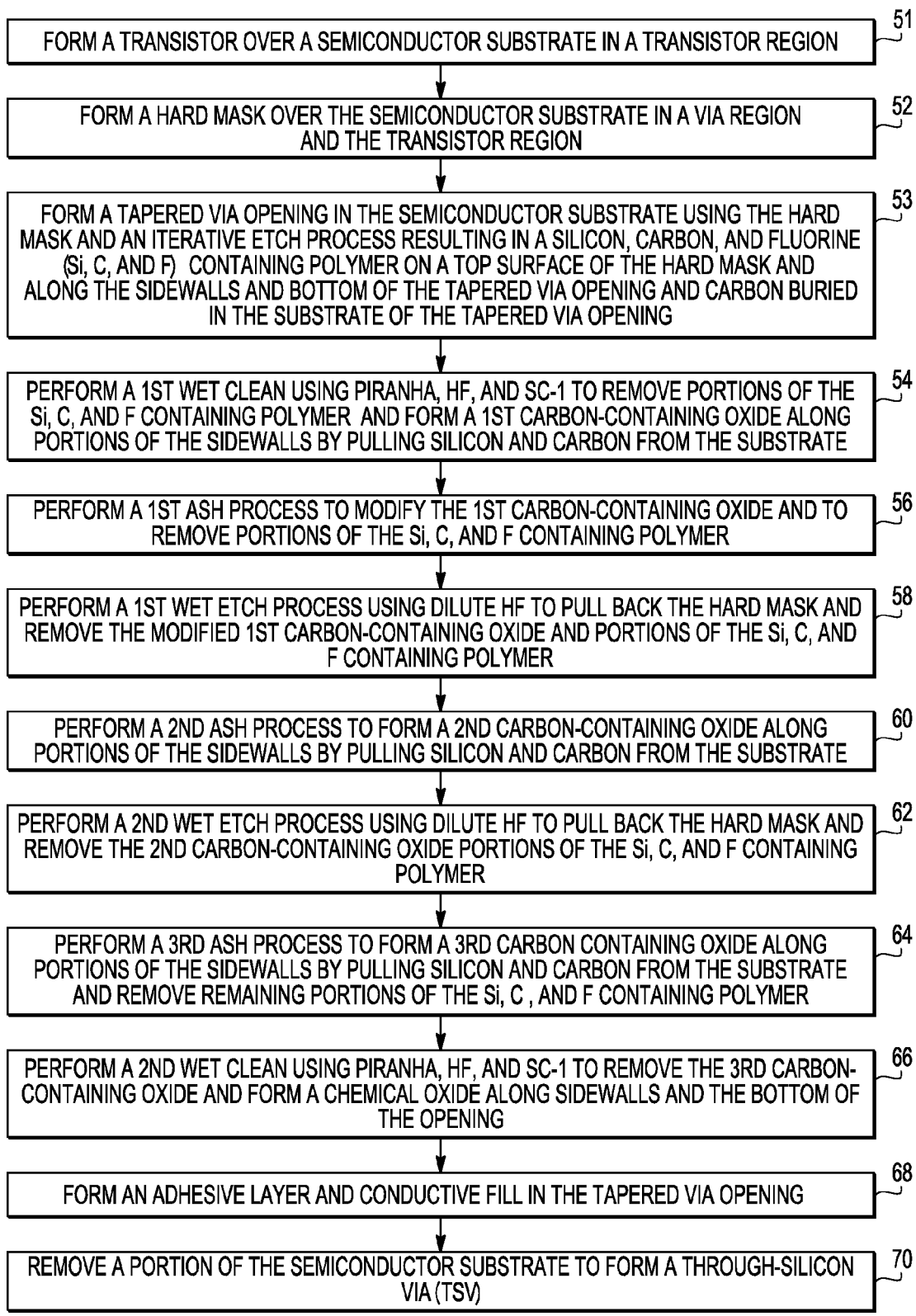
FIG. 11 illustrates, in flow diagram form, a method of forming a TSV in accordance with one embodiment of the present invention.

Referring to the flow of FIG. 11, flow 50 begins with block 51 in which a transistor is formed over a semiconductor substrate in a transistor region. Therefore, referring to FIG. 11, a transistor may be formed in and over substrate 12 in a transistor region (which is not illustrated in FIGS. 1-10) which is adjacent to the via region illustrated in FIG. 1. Known processes may be used to form the transistor. Flow then proceeds to block 52 in which a hard mask is formed over the semiconductor substrate in the via region and the transistor region. Therefore, referring to FIG. 11, hard mask 14 may be formed over both the via region (a portion of which is illustrated in FIGS. 1-10) and the transistor region (not shown). Note that any number of vias can be formed in the via region; however, for ease of explanation, only one via opening is illustrated in FIGS. 1-10. In one embodiment hard mask 14 may include multiple layers. For example, in one embodiment, hard mask 14 may include an interlayer dielectric (ILD), an oxide layer formed by a tetra ethyl ortho silicate (TEOS) process over the ILD layer, and a hard mask layer over the oxide layer. Alternatively, more, less, or different layers may be included in hard mask 14.

Still referring to FIG. 11, flow then proceeds to block 53 in which a tapered via opening is formed in the semiconductor substrate using the hard mask and an iterative etch process resulting in an Si, C, and F containing polymer on a top surface of hard mask 14 and along the sidewalls and bottom of the tapered via opening and carbon buried in the substrate of the tapered via opening. For example, as was described above in reference to FIG. 1, tapered via opening 16 is formed in substrate 12 using hard mask 14 to define the opening. An iterative etch process (such as the Bosch process) is used to form opening 16, which results in Si, C, and F containing polymer 18 along the sidewalls and bottom of tapered via opening 16 and a carbon-containing region 28 in substrate 12 along edges of tapered via opening 16.

Figure 2:
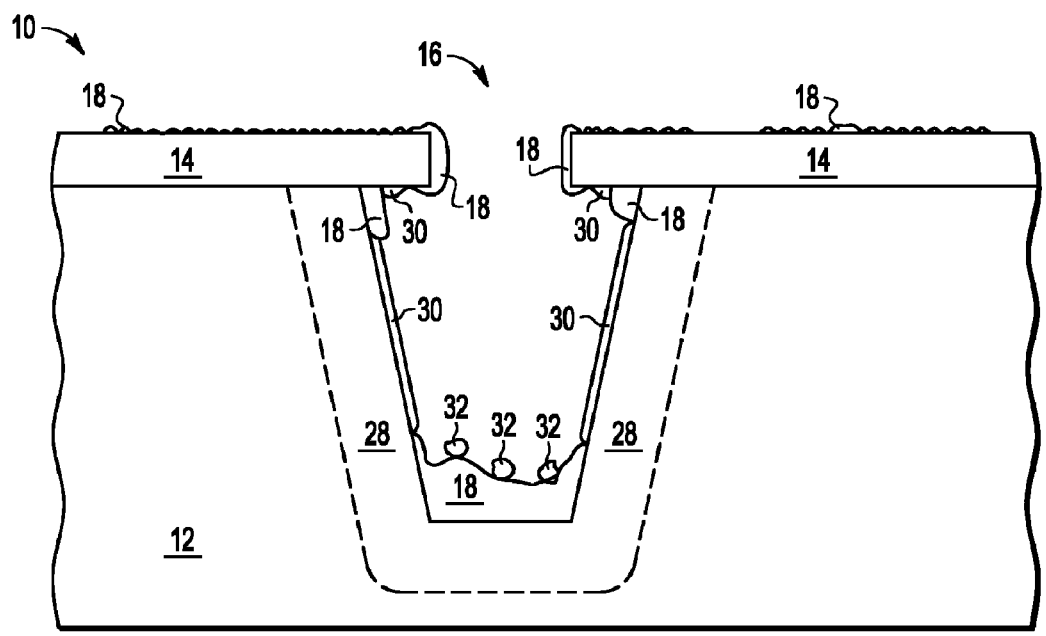
FIG. 2 illustrates a cross-sectional view of the semiconductor structure of FIG. 1, after a first wet clean is performed, in accordance with one embodiment of the present invention.

Flow then proceeds to block 54, in which a first wet clean using piranha, hydrofluoric acid, and SC-1 is used to remove portions of the Si, C, and F containing polymer and form a first carbon-containing oxide along portions of the sidewalls by pulling silicon and carbon from the substrate. Pulling refers to the mechanism by which carbon and silicon is incorporated into the carbon-containing oxide (e.g. carbon-containing silicon dioxide). For example, carbon is captured and incorporated into silicon dioxide during a silicon oxidation phase. Piranha may also be referred to as Sulfuric Peroxide Mix (SPM), and SC-1 may also be referred to as Ammonia Peroxide Mix (APM). Therefore, note that SC-1 includes ammonium hydroxide. For example, FIG. 2 illustrates a cross-section of semiconductor structure 10 after the first wet clean is performed. In one embodiment, after the first wet clean, portions of Si, C, and F containing polymer 18 is removed from the top surface and sidewalls of hard mask 14 and from sidewalls and the bottom of opening 16. However, note that portions of Si, C, and F containing polymer 18 still remains, as illustrated in FIG. 2. Also, as a result of the first wet clean, a carbon-containing oxide 30 is formed along portions of the sidewalls of opening 16. In one embodiment, carbon-containing oxide 30 is a carbon-containing silicon dioxide (such as when substrate 12 is a silicon substrate), and is formed as a non-contiguous layer along portions of the sidewalls of opening 16. For the formation of carbon-containing oxide 30, carbon is pulled from substrate 12, thus shrinking carbon-containing region 28. In one embodiment, carbon-containing oxide 30 has a thickness of approximately 12 Angstroms. Also, during the first wet clean, portions of polymer 18 may break away and form particles 32 of polymer 18 which would also contain Si, C, and F. These particles may result in further contamination of semiconductor structure 10.

Figure 3:
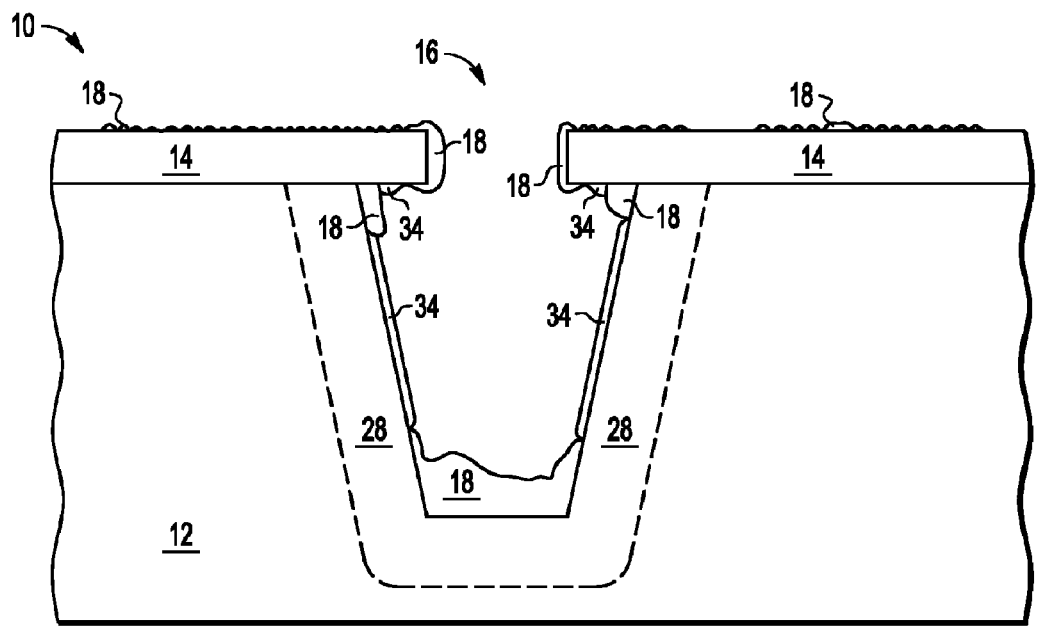
FIG. 3 illustrates a cross-sectional view of the semiconductor structure of FIG. 2, after a first ash process is performed, in accordance with one embodiment of the present invention.

Referring back to FIG. 11, flow then proceeds to block 56, in which a first ash process is performed to modify the first carbon-containing oxide and to remove portions of the Si, C, and F containing polymer. For example, FIG. 3 illustrates a cross-section of semiconductor structure 10 after the first ash process is performed. In one embodiment, the first ash process modifies a surface of carbon-containing oxide 30 to form a modified carbon-containing oxide 34. Also, in one embodiment, the first ash further removes portions of Si, C, and F containing polymer 18 from the top surface and sidewalls of hard mask 14 and from sidewalls and the bottom of opening 16. However, note that portions of Si, C, and F containing polymer 18 may still remain, as illustrated in FIG. 3. Also, the first ash process removes the Si, C, and F containing particles, such as particles 32 (illustrated in FIG. 2). In one embodiment, the ash process is able to reach deep into opening 16 to remove particles 32 and portions of Si, C, and F containing polymer 18.

Figure 4:
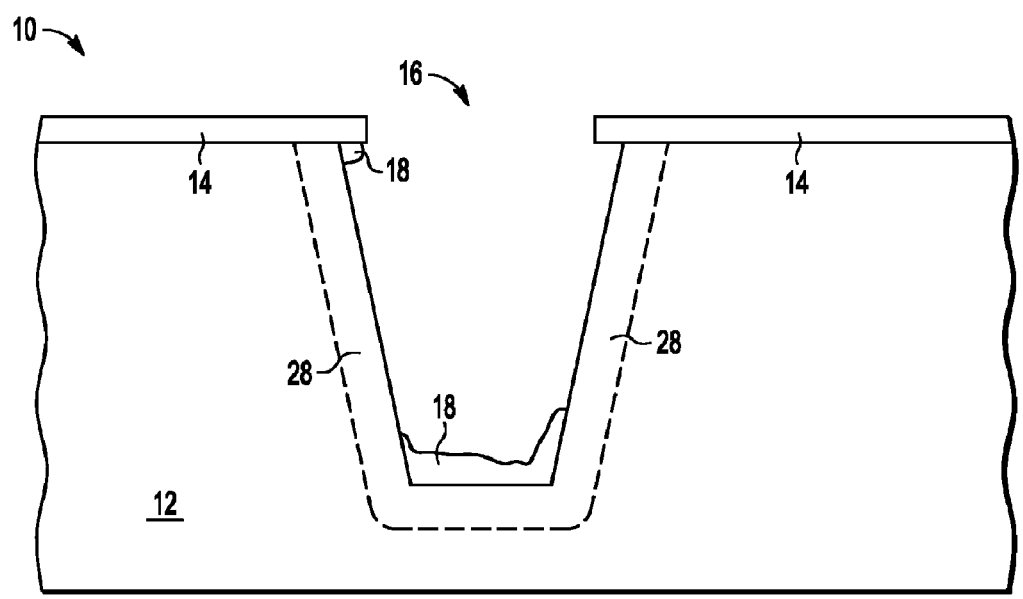
FIG. 4 illustrates a cross-sectional view of the semiconductor structure of FIG. 3, after a first wet etch process is performed, in accordance with one embodiment of the present invention.

Referring back to FIG. 11, flow then proceeds to block 58, in which a first wet etch process is performed using dilute hydrofluoric acid (HF) to pull back the hard mask and remove the modified first carbon containing oxide and portions of the Si, C, and F containing polymer. For example, FIG. 4 illustrates a cross-section of semiconductor structure 10 after the first wet etch process is performed. In one embodiment, the first wet etch process using dilute HF pulls back hard mask 14, thus increasing the diameter of the opening in hard mask 14. That is, the first wet etch process etches hard mask 14 to make the mask opening larger. The dilute HF also removes more portions of Si, C, and F containing polymer 18 from the top surface and sidewalls of hard mask 14 and from sidewalls and the bottom of opening 16, where, in one embodiment, portions of Si, C, and F containing polymer 18 remain at the bottom of opening 16. Therefore, in one embodiment, there are substantially no remaining portions of Si, C, and F containing polymer 18 along the top surface and sidewalls of hard mask 14 and most of polymer 18 is removed from the sidewalls of opening 16. Also, in one embodiment, hard mask 14 is thinned as a result of the wet etch process with dilute HF.

Figure 5:
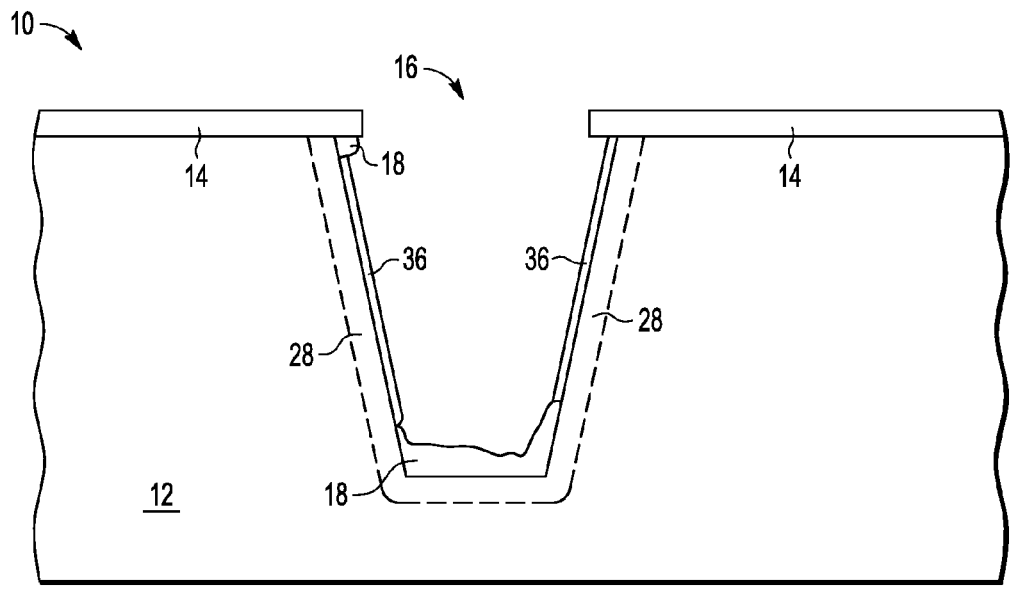
FIG. 5 illustrates a cross-sectional view of the semiconductor structure of FIG. 4, after a second ash process is performed, in accordance with one embodiment of the present invention.

Referring back to FIG. 11, flow then proceeds to block 60, in which a second ash process is performed to form a second carbon-containing oxide along portions of the sidewalls of opening 16 by pulling silicon and carbon from the substrate. For example, FIG. 5 illustrates a cross-section of semiconductor structure 10 after the second ash process is performed. In one embodiment, as a result of the second ash process, a carbon-containing oxide 36 is formed along portions of the sidewalls of opening 16. In one embodiment, carbon-containing oxide 36 is a carbon-containing silicon dioxide (such as when substrate 12 is a silicon substrate), and is formed as a non-contiguous layer along portions of the sidewalls of opening 16. For the formation of carbon-containing oxide 36, carbon is pulled from substrate 12, thus further shrinking carbon-containing region 28. In one embodiment, carbon-containing oxide 36 has a thickness of approximately 12 Angstroms.

Figure 6:
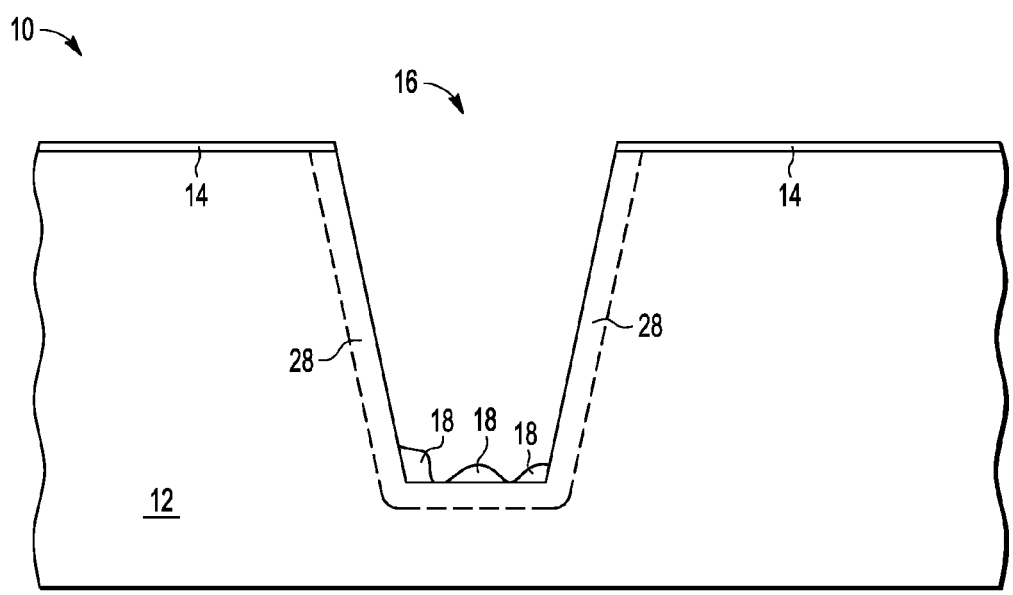
FIG. 6 illustrates a cross-sectional view of the semiconductor structure of FIG. 5, after a second wet etch process is performed, in accordance with one embodiment of the present invention.

Referring back to FIG. 11, flow proceeds to block 62 in which a second wet etch process is performed using dilute HF to pull back the hard mask and remove the second carbon-containing oxide and portions of the Si, C, and F containing polymer. For example, FIG. 6 illustrates a cross-section of semiconductor structure 10 after the second wet etch process is performed. In one embodiment, the second wet etch process using dilute HF further pulls back hard mask 14, thus increasing the diameter of the opening in hard mask 14. That is, the second wet etch process etches hard mask 14 to make the mask opening larger. In one embodiment, the diameter of the opening in hard mask 14 now matches or nearly matches the diameter at the top of opening 16, as seen in FIG. 6. The dilute HF also removes more portions of Si, C, and F containing polymer 18, where, in one embodiment, portions of Si, C, and F containing polymer 18 still remain at the bottom of opening 16. Also, in one embodiment, hard mask 14 is further thinned as a result of the wet etch process with dilute HF.

Figure 7:
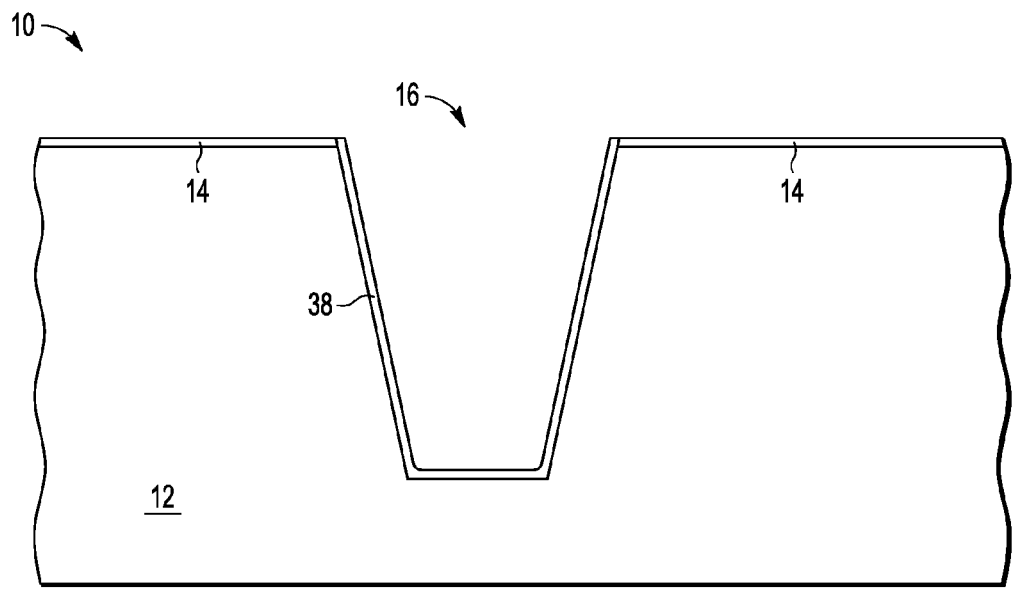
FIG. 7 illustrates a cross-sectional view of the semiconductor structure of FIG. 6, after a third ash process is performed, in accordance with one embodiment of the present invention.

Referring back to FIG. 11, flow proceeds to block 64 in which a third ash process is performed to form a third carbon-containing oxide along portions of the sidewalls by pulling silicon and carbon from the substrate and to remove remaining portions of the Si, C, and F containing polymer. For example, FIG. 7 illustrates a cross-section of semiconductor structure 10 after the third ash process is performed. In one embodiment, the third ash process forms a carbon-containing oxide 38 along portions of the sidewalls of opening 16. In one embodiment, carbon-containing oxide 38 is a carbon-containing silicon dioxide (such as when substrate 12 is a silicon substrate). For the formation of carbon-containing oxide 38, carbon is pulled from substrate 12, thus further shrinking or removing carbon-containing region 28. In one embodiment, carbon-containing oxide 36 has a thickness of approximately 12 Angstroms, and carbon-containing region 28 is substantially no longer present. Therefore, in one embodiment, carbon-containing oxide 36 is substantially contiguous within opening 16.

Figure 8:
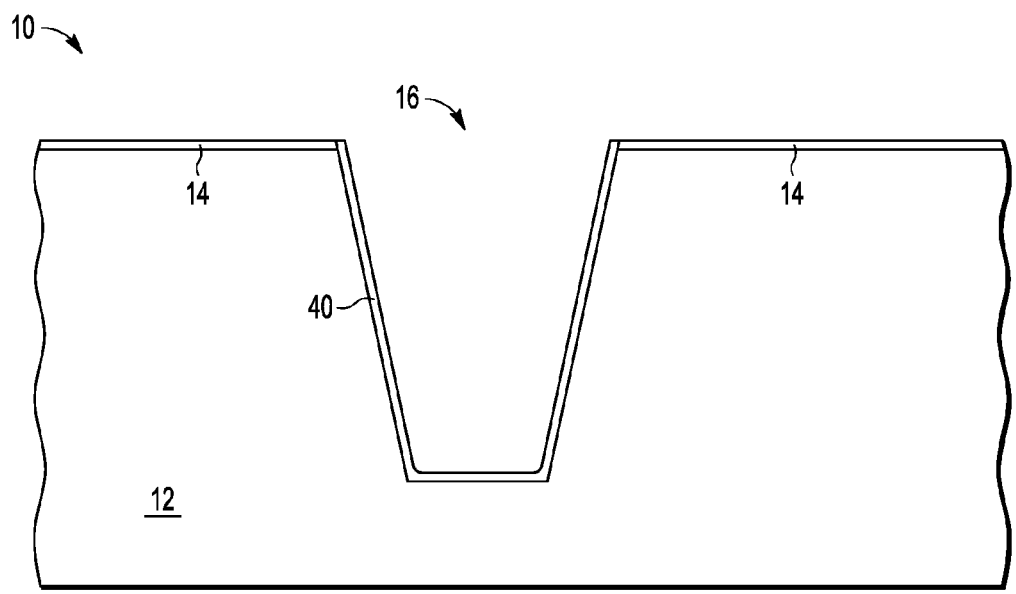
FIG. 8 illustrates a cross-sectional view of the semiconductor structure of FIG. 7, after a second wet clean is performed, in accordance with one embodiment of the present invention.

Referring back to FIG. 11, flow proceeds to block 66 in which a second wet clean is performed using Piranha, HF, and SC-1 to remove the third carbon-containing oxide and to form a chemical oxide along sidewalls and the bottom of opening 16. For example, FIG. 8 illustrates a cross-section of semiconductor structure 10 after the second wet clean is performed. In one embodiment, the second wet clean removes carbon-containing oxide 38 and forms a chemical oxide 40 (such as silicon dioxide) along sidewalls and the bottom of opening 16. In one embodiment, chemical oxide 40 is contiguous within opening 16 since substantially no polymer 18 is left within opening 16.

Referring to FIG. 11, flow proceeds to block 68 in which an adhesive layer is formed within the tapered via opening and a conductive fill is formed within the tapered via opening. For example, FIG. 9 illustrates semiconductor structure 10 after the formation of an adhesive layer 42 within opening 16 and a conductive fill 44 within opening 16. In one embodiment, to form adhesive layer 52 and conductive fill 44, an adhesive layer is deposited over hard mask 14 and substrate 12, within opening 16, and a conductive fill layer is deposited over the adhesive layer. In one embodiment, chemical mechanical polishing (CMP) is used to remove portions of the adhesive layer and conductive fill layer over hard mask 14, thus resulting in adhesive layer 40 and conductive fill 44. In one embodiment, adhesive layer 42 includes titanium and titanium nitride, and in one embodiment, conductive fill includes tungsten. Alternatively, conductive fill includes copper. In one embodiment, adhesive layer 42 may include multiple layers.

Referring back to FIG. 11, flow then proceeds to block 70 in which a portion of the semiconductor substrate is removed to form a TSV. For example, FIG. 10 illustrates a cross-section of semiconductor substrate 10 after portions of the backside of substrate 12 have been removed to expose a bottom end (i.e. the tapered end, opposite the top end of opening 16). Therefore, a TSV is formed which extends through substrate 12 and hard mask 14, thus being exposed at both ends, i.e., at opposite ends.

By now it should be appreciated that there has been provided a method for forming a reliable TSV by removing the remaining polymer which results from the formation of the opening for the TSV. In one embodiment, an iterative process is used to remove the residual polymer which includes, for example, a predetermined number of iterations of an ash process followed by a wet etch process. In one embodiment, the predetermined number of iterations is two. In one embodiment, the predetermined number of iterations of an ash process followed by a wet etch process is preceded by a wet clean, and followed by a third ash process and a second wet clean. Therefore, in this manner, by removing the remaining polymer, a more reliable TSV can be formed.

Although the invention has been described with respect to specific conductivity types or polarity of potentials, skilled artisans appreciated that conductivity types and polarities of potentials may be reversed. Moreover, the terms "front," "back," "top," "bottom," "over," "under" and the like in the description and in the claims, if any, are used for descriptive purposes and not necessarily for describing permanent relative positions. It is understood that the terms so used are interchangeable under appropriate circumstances such that the embodiments of the invention described herein are, for example, capable of operation in other orientations than those illustrated or otherwise described herein.

Although the invention is described herein with reference to specific embodiments, various modifications and changes can be made without departing from the scope of the present invention as set forth in the claims below. For example, different materials may be used to form a TSV. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

The following are various embodiments of the present invention.

Item 1 includes a method of forming a through silicon via (TSV) which includes forming a hard mask over a semiconductor substrate, wherein the hard mask has a mask opening and forming a via opening in the semiconductor substrate using the hard mask. The via opening comprises a bottom and sidewalls, a portion of the hard mask overhangs the via opening, and a polymer comprising silicon, carbon, and fluorine is formed along at least a portion of the bottom of the via opening. The method of item 1 further includes performing a first wet clean to remove a first portion of the polymer and form a first carbon containing oxide along portions of the sidewalls by pulling silicon and carbon from the substrate; performing a first ash process to modify the first carbon containing oxide and to remove a second portion of the polymer; performing a first wet etch process to remove the modified first carbon containing oxide and a third portion of the polymer; performing a second ash process to form a second carbon containing oxide along at least a portion of the sidewalls by pulling silicon and carbon from the semiconductor substrate; performing a second wet etch process to remove the second carbon containing oxide and a fourth portion of the polymer; and performing a third ash process to form a third carbon containing oxide along portions of the sidewalls by pulling silicon and carbon from the substrate and removing any remaining portions of the polymer. Item 2 include the method of item 1, wherein performing the first wet etch process further comprises etching the hard mask to make the mask opening larger. Item 3 includes the method of item 2, wherein performing the second wet etch process further comprises etching the hard mask to make the mask opening larger. Item 4 includes the method of item 1, and further includes forming an adhesive layer and conductive fill within the via opening. Item 5 includes the method of item 4, and further includes removing a portion of the semiconductor substrate. Item 6 includes the method of item 1, wherein the polymer is also formed along at least a portion of the sidewall of the via opening. Item 7 includes the method of item 1, wherein performing the first wet etch process and the second wet etch process comprise using dilute hydrofluoric acid. Item 8 includes the method of item 1, wherein performing a first wet clean comprises using piranha, hydrofluoric acid, and ammonium hydroxide. Item 9 includes the method of item 1, and further includes performing a second wet clean to remove the third carbon containing oxide and form a chemical oxide along the sidewalls and bottom of the via opening. Item 10 include the method of item 9, wherein performing a second wet clean comprises using piranha, hydrofluoric acid, and ammonium hydroxide. Item 11 includes the method of item 1, wherein the hard mask comprises multiple layers. Item 12 includes the method of item 1, wherein the first, second and third carbon containing oxides comprise silicon and oxygen.

Item 13 includes a method of forming a through silicon via (TSV) including forming a hard mask over a semiconductor substrate; and forming a via opening in the semiconductor substrate using the hard mask. The via opening comprises a bottom and sidewalls, and a polymer comprising silicon, carbon, and fluorine is formed along at least a portion of the bottom of the via opening. The method of item 13 further includes performing a wet clean to remove a first portion of the polymer and form a first carbon containing oxide along portions of the sidewalls by pulling silicon and carbon from the substrate; performing an ash process to remove a second portion of the polymer; performing a wet process to remove a third portion of the polymer; repeating the steps of performing an ash process and performing a wet process a predetermined number of times; forming an oxide along the sidewalls and bottom of the opening; forming an adhesion layer and a conductive fill in the via opening; and removing a portion of the semiconductor substrate. Item 14 includes the method of item 13, wherein the predetermined number of times is one time. Item 15 includes the method of item 14, wherein the hard mask has a mask opening and the first wet etch process further comprises etching the hard mask to make the mask opening larger. Item 16 includes the method of item 15, wherein performing the second wet etch process further comprises etching the hard mask to make the mask opening larger. Item 17 includes the method of item 16, wherein the polymer is formed along at least a portion of the sidewall of the via opening. Item 18 includes the method of item 17, wherein performing the first wet etch process and the second wet etch process comprise using dilute hydrofluoric acid. Item 19 includes the method of item 18, wherein forming an oxide along the sidewalls and bottom of the opening comprises performing a wet process.

Item 20 includes a method of forming a through silicon via (TSV) including forming a hard mask over a semiconductor substrate; and forming a via opening in the semiconductor substrate using the hard mask. The via opening comprises a bottom and sidewalls, and a polymer comprising silicon, carbon, and fluorine is formed along at least a portion of the bottom of the via opening. The method of item 20 further includes performing a first wet clean using piranha, hydrofluoric acid and ammonium hydroxide to remove a first portion of the polymer and form a first carbon containing oxide along portions of the sidewalls by pulling silicon and carbon from the substrate; performing a first ash process to modify the first carbon containing oxide and to remove a second portion of the polymers; performing a first wet etch process using dilute hydrofluoric acid to remove the modified first carbon containing oxide and a third portion of the polymer; performing a second ash process to form a second carbon containing oxide along at least a portion of the sidewalls by pulling silicon and carbon from the semiconductor substrate; performing a second wet etch process using dilute hydrofluoric acid to remove the second carbon containing oxide and a fourth portions of the polymer; performing a third ash process to form a third carbon containing oxide along portions of the sidewalls by pulling silicon and carbon from the substrate and removing any remaining portions of the polymer; performing a second wet clean piranha, hydrofluoric acid and ammonium hydroxide to remove the third carbon containing oxide and form a chemical oxide along the sidewalls and bottom of the via opening; forming an adhesion layer and a conductive fill in the via opening; and removing a portion of the semiconductor substrate.

What is claimed is:
1. A method of forming a through silicon via (TSV), the method comprising:
    forming a hard mask over a semiconductor substrate, wherein the hard mask has a mask opening;
    forming a via opening in the semiconductor substrate using the hard mask, wherein:
        the via opening comprises a bottom and sidewalls;
        a portion of the hard mask overhangs the via opening; and
        a polymer comprising silicon, carbon, and fluorine is formed along at least a portion of the bottom of the via opening;
    performing a first wet clean to remove a first portion of the polymer and form a first carbon containing oxide along portions of the sidewalls by pulling silicon and carbon from the substrate;
    performing a first ash process to modify the first carbon containing oxide and to remove a second portion of the polymer;
    performing a first wet etch process to remove the modified first carbon containing oxide and a third portion of the polymer;
    performing a second ash process to form a second carbon containing oxide along at least a portion of the sidewalls by pulling silicon and carbon from the semiconductor substrate;
    performing a second wet etch process to remove the second carbon containing oxide and a fourth portion of the polymer; and
    performing a third ash process to form a third carbon containing oxide along portions of the sidewalls by pulling silicon and carbon from the substrate and removing any remaining portions of the polymer.

2. The method of claim 1, wherein performing the first wet etch process further comprises etching the hard mask to make the mask opening larger.

3. The method of claim 2, wherein performing the second wet etch process further comprises etching the hard mask to make the mask opening larger.

4. The method of claim 1, further comprising forming an adhesive layer and conductive fill within the via opening.

5. The method of claim 4, further comprising removing a portion of the semiconductor substrate.

6. The method of claim 1, wherein the polymer is also formed along at least a portion of the sidewall of the via opening.

7. The method of claim 1, wherein performing the first wet etch process and the second wet etch process comprise using dilute hydrofluoric acid.

8. The method of claim 1, wherein performing a first wet clean comprises using piranha, hydrofluoric acid, and ammonium hydroxide.

9. The method of claim 1, further comprising performing a second wet clean to remove the third carbon containing oxide and form a chemical oxide along the sidewalls and bottom of the via opening.

10. The method of claim 9, wherein performing a second wet clean comprises using piranha, hydrofluoric acid, and ammonium hydroxide.

11. The method of claim 1, wherein the hard mask comprises multiple layers.

12. The method of claim 1, wherein the first, second and third carbon containing oxides comprise silicon and oxygen.

13. A method of forming a through silicon via (TSV), the method comprising:
    forming a hard mask over a semiconductor substrate;
    forming a via opening in the semiconductor substrate using the hard mask, wherein:
        the via opening comprises a bottom and sidewalls; and
        a polymer comprising silicon, carbon, and fluorine is formed along at least a portion of the bottom of the via opening;
    performing a wet clean to remove a first portion of the polymer and form a first carbon containing oxide along portions of the sidewalls by pulling silicon and carbon from the substrate;
    performing an ash process to remove a second portion of the polymer;
    performing a wet process to remove a third portion of the polymer; and
    repeating the steps of performing an ash process and performing a wet process a predetermined number of times;
    forming an oxide along the sidewalls and bottom of the opening;
    forming an adhesion layer and a conductive fill in the via opening; and
    removing a portion of the semiconductor substrate.

14. The method of claim 13, wherein the predetermined number of times is one time.

15. The method of claim 14, wherein the hard mask has a mask opening and the first wet etch process further comprises etching the hard mask to make the mask opening larger.

16. The method of claim 15, wherein performing the second wet etch process further comprises etching the hard mask to make the mask opening larger.

17. The method of claim 16, wherein the polymer is formed along at least a portion of the sidewall of the via opening.

18. The method of claim 17, wherein performing the first wet etch process and the second wet etch process comprise using dilute hydrofluoric acid.

19. The method of claim 18, wherein forming an oxide along the sidewalls and bottom of the opening comprises performing a wet process.

20. A method of forming a through silicon via (TSV), the method comprising:
    forming a hard mask over a semiconductor substrate;
    forming a via opening in the semiconductor substrate using the hard mask, wherein:
        the via opening comprises a bottom and sidewalls; and
        a polymer comprising silicon, carbon, and fluorine is formed along at least a portion of the bottom of the via opening;
    performing a first wet clean using piranha, hydrofluoric acid and ammonium hydroxide to remove a first portion of the polymer and form a first carbon containing oxide along portions of the sidewalls by pulling silicon and carbon from the substrate;
    performing a first ash process to modify the first carbon containing oxide and to remove a second portion of the polymers;
    performing a first wet etch process using dilute hydrofluoric acid to remove the modified first carbon containing oxide and a third portion of the polymer;
    performing a second ash process to form a second carbon containing oxide along at least a portion of the sidewalls by pulling silicon and carbon from the semiconductor substrate;
    performing a second wet etch process using dilute hydrofluoric acid to remove the second carbon containing oxide and a fourth portions of the polymer;
    performing a third ash process to form a third carbon containing oxide along portions of the sidewalls by pulling silicon and carbon from the substrate and removing any remaining portions of the polymer;
    performing a second wet clean piranha, hydrofluoric acid and ammonium hydroxide to remove the third carbon containing oxide and form a chemical oxide along the sidewalls and bottom of the via opening;
    forming an adhesion layer and a conductive fill in the via opening; and
    removing a portion of the semiconductor substrate.

* * * * *